(12) United States Patent
Kim

(10) Patent No.: US 8,383,453 B2
(45) Date of Patent: Feb. 26, 2013

(54) METHOD OF MANUFACTURING ORGANIC LIGHT EMITTING DISPLAY APPARATUS AND ORGANIC LIGHT EMITTING DISPLAY APPARATUS

(75) Inventor: Won-Yong Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 254 days.

(21) Appl. No.: 12/926,586

(22) Filed: Nov. 29, 2010

(65) Prior Publication Data
US 2011/0127502 A1 Jun. 2, 2011

(30) Foreign Application Priority Data

Nov. 30, 2009 (KR) .................. 10-2009-0117087

(51) Int. Cl.
*H01L 51/40* (2006.01)
(52) U.S. Cl. ............ 438/99; 438/82; 430/127; 430/132; 257/40; 257/E51.001
(58) Field of Classification Search ............ 438/99, 438/82; 430/127, 132; 257/E51.001, 40
See application file for complete search history.

(56) References Cited

U.S. PATENT DOCUMENTS

| | | | |
|---|---|---|---|
| 6,878,470 B2 * | 4/2005 | Kawamura et al. | 428/690 |
| 7,244,669 B2 * | 7/2007 | Sirringhaus et al. | 438/535 |
| 7,629,102 B2 * | 12/2009 | Ochi et al. | 430/127 |
| 7,662,314 B2 * | 2/2010 | Han et al. | 252/500 |
| 7,732,249 B2 * | 6/2010 | Mizuno et al. | 438/99 |
| 7,833,569 B2 * | 11/2010 | Chae et al. | 427/66 |
| 2003/0143339 A1 | 7/2003 | Kobayashi | |
| 2003/0230967 A1 | 12/2003 | Kawamura et al. | |
| 2004/0266207 A1 * | 12/2004 | Sirringhauss et al. | 438/725 |
| 2006/0175964 A1 * | 8/2006 | Han et al. | 313/506 |
| 2006/0223221 A1 | 10/2006 | Ishii | |
| 2006/0249732 A1 * | 11/2006 | Shirasaki et al. | 257/59 |
| 2007/0071885 A1 | 3/2007 | Kumagai | |
| 2007/0243651 A1 * | 10/2007 | Mizuno et al. | 438/38 |
| 2008/0150418 A1 * | 6/2008 | Chae et al. | 313/504 |
| 2009/0023091 A1 * | 1/2009 | Ochi et al. | 430/133 |

FOREIGN PATENT DOCUMENTS

| | | |
|---|---|---|
| JP | 2003-323983 A | 11/2003 |
| JP | 2004-095850 A | 3/2004 |
| JP | 2007-044582 A | 2/2007 |
| KR | 10 2003-0055121 A | 7/2003 |
| KR | 10 2005-0080462 A | 8/2005 |
| KR | 10 2006-0105495 A | 10/2006 |
| KR | 10 2007-0036700 A | 4/2007 |
| KR | 10 2008-0057412 A | 6/2008 |

\* cited by examiner

*Primary Examiner* — Telly Green
(74) *Attorney, Agent, or Firm* — Lee & Morse, P.C.

(57) ABSTRACT

A method of manufacturing an organic light emitting display apparatus includes forming first electrodes on a substrate, forming a pixel defining layer (PDL) on the substrate and first electrodes, the PDL including openings exposing predetermined areas of the first electrodes, forming a charge transport layer on the PDL and inside the openings of the PDL, performing a hydrophobic process on the charge transport layer, performing a hydrophilic process on the charge transport layer, such that portions of the charge transport layer corresponding to the openings are made hydrophilic, forming organic light emitting layers on the charge transport layer, and forming a second electrode electrically connected to the organic light emitting layers.

16 Claims, 6 Drawing Sheets

METHOD OF MANUFACTURING ORGANIC LIGHT EMITTING DISPLAY APPARATUS AND ORGANIC LIGHT EMITTING DISPLAY APPARATUS

BACKGROUND

1. Field

Example embodiments relate to a method of manufacturing an organic light emitting display apparatus and an organic light emitting display apparatus. More particularly, example embodiments relate to a method of manufacturing an organic light emitting display apparatus by which organic light emitting layers are easily formed.

2. Description of the Related Art

A display apparatus has been replaced with a portable thin film type flat panel display (FPD) apparatus. Among FPD apparatuses, an electroluminescent display apparatus is a self-luminous display apparatus which has a wide viewing angle, a high-quality contrast, and a fast response time. Thus, the electroluminescent display apparatus attracts attention as a next generation display apparatus.

The electroluminescent display apparatus, e.g., an organic light emitting display apparatus, may include light emitting layers, e.g., formed of an organic material, having high-quality luminance, driving voltage, and response time. In addition, the organic light emitting display apparatus may exhibit polychromatic characteristics, as compared with an inorganic light emitting display apparatus.

A conventional organic light emitting display apparatus may include a cathode electrode, an anode electrode, and organic light emitting layers. When voltage is applied to the cathode and anode electrodes, the organic light emitting layers emit visible rays.

The organic light emitting display apparatus may include sub-pixels for realizing red (R), green (G), and blue (B) visible rays in order to realize a natural color screen. Organic light emitting layers are formed in R sub-pixels to emit the R visible rays, in G sub-pixels to emit the G visible rays, and in B sub-pixels to emit the B visible rays.

SUMMARY

Embodiments are directed to a method of manufacturing an organic light emitting display apparatus and an organic light emitting display apparatus, which substantially overcome one or more of the problems due to the limitations and disadvantages of the related art.

It is therefore a feature of an embodiment to provide an organic light emitting display apparatus and a method of manufacturing the same by simplifying the formation process of the organic light emitting layers therein.

At least one of the above and other features and advantages may be realized by providing a method of manufacturing an organic light emitting display apparatus, including forming a pixel defining layer (PDL) on the substrate and first electrodes, the PDL including openings exposing predetermined areas of the first electrodes, forming a charge transport layer on the PDL and inside the openings of the PDL, performing a hydrophobic process on the charge transport layer, performing a hydrophilic process on the charge transport layer, such that portions of the charge transport layer corresponding to the openings are made hydrophilic, forming organic light emitting layers on the charge transport layer, and forming a second electrode electrically connected to the organic light emitting layers.

The organic light emitting layers may be formed on the charge transport layer to respectively correspond to the openings. The charge transport layer may include a hole transfer layer (HTL) and/or a hole injection layer (HIL). The hydrophobic process for the surface of the charge transport layer may be performed under atmosphere of a fluoride compound gas using plasma or ultraviolet rays. The fluoride compound gas may include $CF_4$.

Performing the hydrophilic process may include irradiating ultraviolet light onto regions of the charge transport layer corresponding to the openings. The hydrophilic process may include providing a mask including transmissive areas respectively corresponding to the openings, and radiating energy onto the mask using an ultraviolet lamp. The hydrophilic process may include radiating energy onto the areas of the surface of the charge transport layer corresponding to the openings using an ultraviolet laser. The hydrophilic process may be performed by scanning ultraviolet laser beams focused to sizes corresponding to the openings. The hydrophilic process may include making the exposed areas of the surface of the charge transport layer corresponding to bottom and inside surfaces of the openings hydrophilic. The hydrophilic process may be performed in an ambience of air or a nitrogen gas Performing the hydrophilic process may include making an upper surface of the charge transport layer hydrophilic only inside the openings of the PDL. After the hydrophilic process, a hydrophobic portion of the charge transport layer may be defined on an upper surface of the PDL around the openings. A portion of a hydrophilic charge transport layer inside each opening may be completely surrounded by a portion of a hydrophobic charge transport layer. The hydrophobic process may be performed before the hydrophilic process. The hydrophobic process may be performed on an entire upper surface of the charge transport layer, and the hydrophilic process may be performed only on portions of the charge transport layer corresponding to the openings. The organic light emitting layers may be formed using a nozzle printing method. An organic light emitting display apparatus may be manufactured by the above method.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
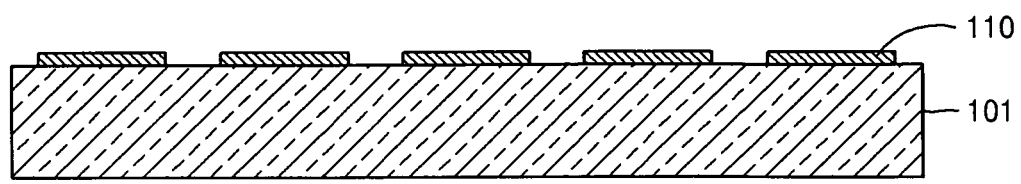
FIGS. 1A, 1B, and 1D-1H illustrate cross-sectional views of stages in a method of manufacturing an organic light emitting display apparatus according to an embodiment.

Korean Patent Application No. 10-2009-0117087, filed on Nov. 30, 2009, in the Korean Intellectual Property Office, and entitled: "Method of Manufacturing Organic Light Emitting Display Apparatus and Organic Light Emitting Display Apparatus," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

A structure and an operation of example embodiments will now be described in detail with reference to FIGS. 1A-1H. FIGS. 1A through 1H illustrate views of stages in a method of manufacturing an organic light emitting display apparatus according to an embodiment.

Referring to FIG. 1A, first electrodes 110 may be formed on a substrate 101. Before the first electrodes 110 are formed, a thin film transistor (not shown) may be formed on the substrate 101. It is noted that the method according to the example embodiment may be applied to a method of manufacturing an active matrix (AM) organic light emitting display and/or a method of manufacturing a passive matrix (PM) organic light emitting display apparatus.

The substrate 101 may be formed of a transparent glass material, e.g., including $SiO_2$ as a main ingredient. The substrate 101, however, is not limited thereto, e.g., it may be formed of a transparent plastic material or of metal. An example of a transparent plastic material may include an insulating organic material, e.g., one or more of polyethersulphone (PES), polyacrylate (PAR), polyetherimide (PEI), polyethylene-naphthalate (PEN), polyethylene-terephthalate (PET), polyphenylene sulfide (PPS), polyallylate, polyimide, polycarbonate (PC), cellulose triacetate (TAC), and cellulose acetate propionate (CAP). Examples of metals may include one or more of iron (Fe), chromium (Cr), manganese (Mn), nickel (Ni), titanium (Ti), molybdenum (Mo), stainless steel (SUS), an invar alloy, an Inconel® alloy, a Kovar Alloy®, etc. The substrate 101 may be formed in a foil form.

A buffer layer (not shown) may be formed on the substrate 101 in order to smooth an upper surface of the substrate 101 and to prevent a permeation of impure elements into the substrate 101. The buffer layer may be formed of, e.g., $SiO_2$ and/or $SiN_x$, or the like.

The first electrodes 110 may be formed on the substrate 101. The first electrodes 110 may be formed in predetermined patterns, e.g., using photolithography. For example, the patterns of the first electrodes 110 may be striped lines, which keep predetermined distances from one another, in a PM-type organic light emitting display apparatus. In another example, the patterns of the first electrodes 110 may have forms corresponding to sub-pixels in an AM-type organic light emitting display apparatus.

The first electrodes 110 may be reflective electrodes or transmissive electrodes. If the first electrodes 110 are reflective electrodes, a reflective layer may be formed of, e.g., one or more of Ag, Mg, Al, Pt, Pd, Au, Ni, Nd, Ir, Cr, Li, Ca, or a compound thereof, and an additional layer having a high work function, e.g., one or more of ITO, IZO, ZnO, and $In_2O_3$, may be deposited on the reflective layer of the first electrodes 110. If the first electrodes 110 are transmissive electrodes, the first electrodes 110 may be formed of a material having a high work function, e.g., one or more of ITO, IZO, ZnO, $In_2O_3$, etc.

Figure 1B:
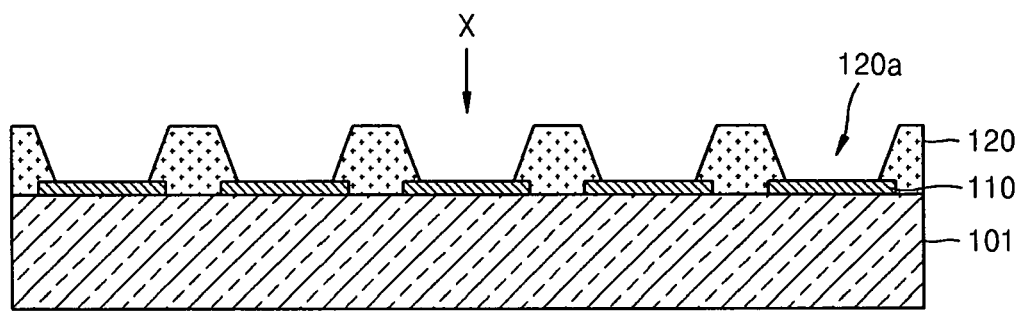

Referring to FIG. 1B, a pixel defining layer (PDL) 120 may be formed on the first electrodes 110. The PDL 120 may include openings 120a through which the first electrodes 110 are exposed. The PDL 120 may be formed of an insulating material.

Figure 1C:
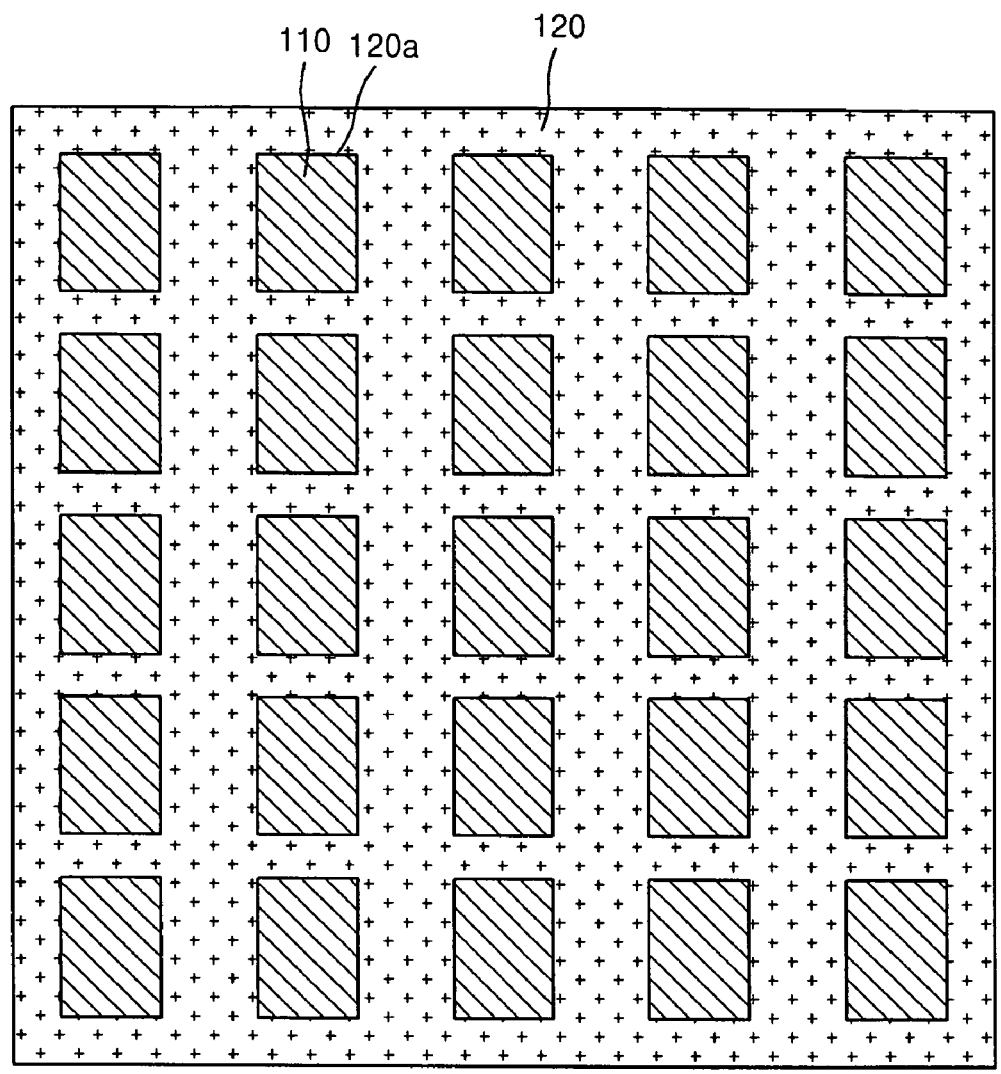
FIG. 1C illustrates a top view of FIG. 1B.

FIG. 1C illustrates a top view as seen from direction "X" of FIG. 1B. As illustrated in FIG. 1C, the PDL 120 may have a predetermined pattern on the substrate 101, so the openings 120a may expose upper surfaces of the first electrodes 110. For example, the PDL 120 may be shaped as a grid, so the openings 120a may have rectangular shapes arranged in a matrix pattern. However, example embodiments are not limited thereto, and the openings 120a may have any suitable shapes, e.g., polygonal or curved shapes.

Figure 1D:
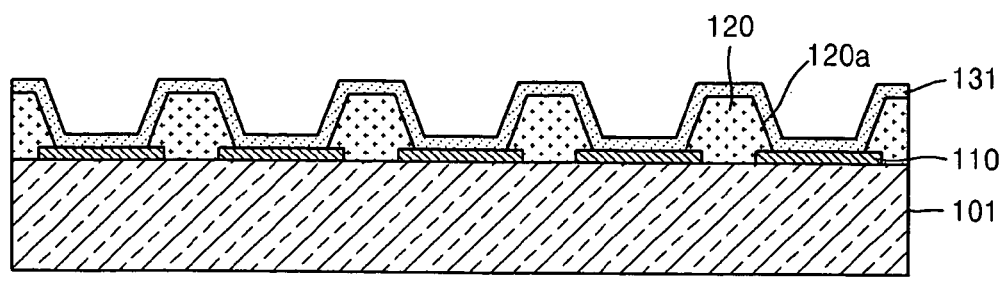

Referring to FIG. 1D, a charge transport layer 131 may be formed on the substrate 101, e.g., on the PDL 120 and the first electrodes 110 exposed through the PDL 120. That is, the charge transport layer 131 may be formed, e.g., conformally, on a whole surface of the PDL 120 and areas of the first electrodes 110 exposed through the openings 120a, i.e., the charge transport layer 131 may be formed without an additional patterning process.

The charge transport layer 131 may include a hole transfer layer (HTL) and/or a hole injection layer (HIL). The charge transport layer 131 may include only one of the HTL and the HIL or both of the HTL and the HIL. If the charge transport layer 131 includes both of the HTL and the HIL, the HIL may be disposed closer to the first electrodes 110 than the HTL.

Figure 1E:
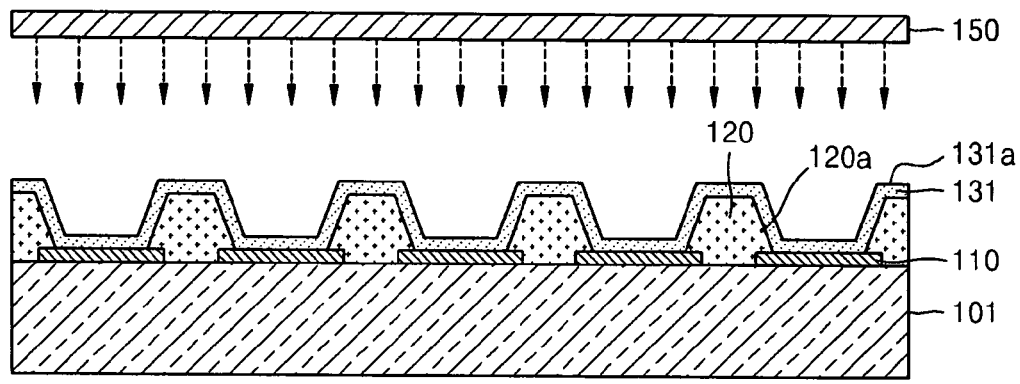

Referring to FIG. 1E, a surface of the charge transport layer 131 may be made hydrophobic using a hydrophobic conversion processing unit 150. For example, the hydrophobic conversion processing unit 150 may be positioned to process an entire upper surface 131a of the charge transport layer 131, i.e., a surface facing away from the substrate 101, so the entire upper surface 131a of the charge transport layer 131 may be made hydrophobic.

In detail, the hydrophobic conversion processing unit 150 may be a plasma apparatus or an ultraviolet lamp. The hydrophobic conversion processing unit 150 may employ a reaction gas, e.g., a fluoride-based reaction gas. For example, the hydrophobic conversion processing unit 150 may employ $CF_4$ as the reaction gas. When the hydrophobic conversion processing unit 150 generates plasma or ultraviolet rays under an atmosphere of $CF_4$, $CF_4$ decomposes to generate fluoride ions, which in turn, adsorb onto the upper surface 131a of the charge transport layer 131. When the upper surface 131a of the charge transport layer 131 is combined with the adsorbed fluoride ions, surface energy of the upper surface 131a of the charge transport layer 131 is reduced to become a hydrophobic surface.

Figure 1F:
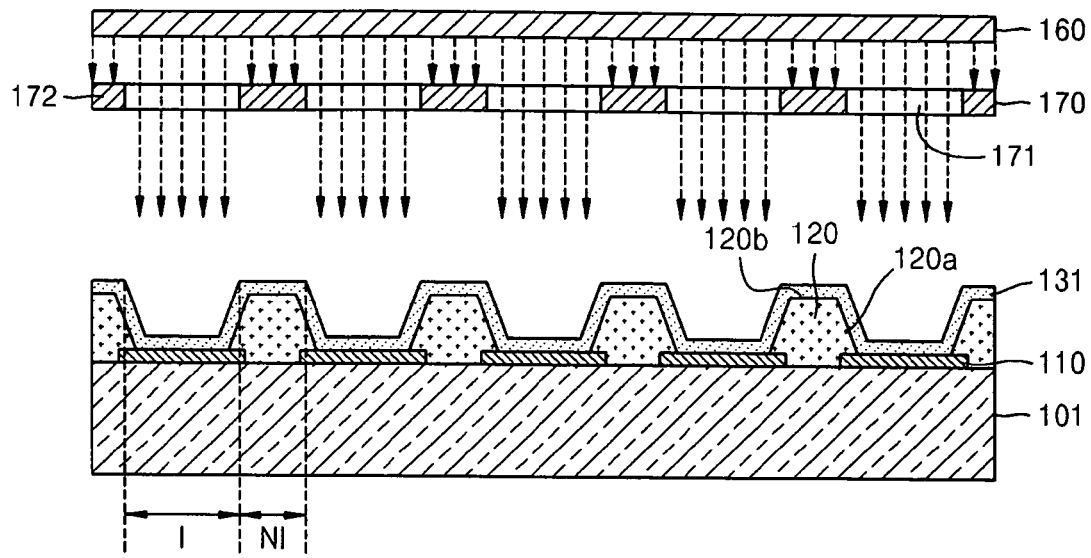

Referring to FIG. 1F, predetermined areas of the upper surface 131a of the charge transport layer 131 may be made hydrophilic. In detail, portions of the hydrophobic upper surface 131a of the charge transport layer 131 may be selectively treated to become hydrophilic. In further detail, a mask may be used, so portions of the upper surface 131a of the charge transport layer 131 corresponding to, e.g., overlapping, the openings 120a of the PDL 120 may be made hydrophilic.

That is, a mask 170 may be disposed above the charge transport layer 131, and an ultraviolet lamp 160 may be disposed above the mask 170 to radiate ultraviolet rays through the mask 170 onto the predetermined areas of the upper surface 131a of the charge transport layer 131. The mask 170 may have transmissive areas 171, i.e., areas which transmit the ultraviolet rays generated by the ultraviolet lamp 160 toward the charge transport layer 131, and non-transmissive areas 172, i.e., areas of the mask 170 which do not transmit the ultraviolet rays. The mask 170 may be positioned such that the transmissive areas 171 may respectively correspond to, e.g., overlap, top of the openings 120a, and the non-transmissive areas 172 may correspond to, e.g., overlap, the PDL 120. For example, each transmissive area 171 of the mask 170 may overlap an entire corresponding opening 120a, such that portions of the charge transport layer 131 on the bottom and sidewalls of the opening 120a, e.g., portions of the charge transport layer 131 inside the openings 120a, may be irradiated with ultraviolet light, i.e., area I in FIG. 1F. Similarly, each non-transmissive area 172 of the mask 170 may overlap an entire upper surface 120b of the PDL 120, i.e., a surface parallel to and facing away from the substrate 101, to block ultraviolet light radiation on portions of the charge transport layer 131 on the upper surface 120b of the PDL 120, i.e., area NI in FIG. 1F.

The ultraviolet rays generated by the ultraviolet lamp 160 transmit through the transmissive areas 171 and then reach the charge transport layer 131. In other words, the ultraviolet rays reach the areas of the surface of the charge transport layer 131 corresponding to the openings 120a, i.e., in areas I. The ultraviolet rays that reach the charge transport layer 131 separate the fluoride ions from the upper surface 131a of the charge transport layer 131 in regions I.

The hydrophilic process may be performed in an ambience of air and/or a nitrogen gas. The ultraviolet rays generated by the ultraviolet lamp 160 ionize the air or the nitrogen gas, and the ions of the air and the nitrogen gas adsorb onto the upper surface 131a of the charge transport layer 131 in areas I, i.e., inside the openings 120a. Portions of the upper surface 131a of the charge transport layer 131 onto which the ions of air or nitrogen are adsorbed exhibit increased surface energy and become a hydrophilic surface.

Therefore, areas of the upper surface 131a of the charge transport layer 131 on bottom surfaces of the openings 120a exposing the first electrodes 110 and side surfaces of the openings 120a are made hydrophilic to have a hydrophilic characteristic. Areas of the upper surface 131a of the charge transport layer 131 formed on the upper surface 120b of the PDL 120 are made hydrophobic to have a hydrophobic characteristic. For example, referring to FIGS. 3 and 1F, inside surfaces of each opening 120a, i.e., bottom and side surfaces, may be hydrophilic, while regions of the upper surface 120b surrounding the openings 120a, i.e., corresponding to the PDL 120 illustrated in FIG. 3, may be hydrophobic.

Figure 1G:
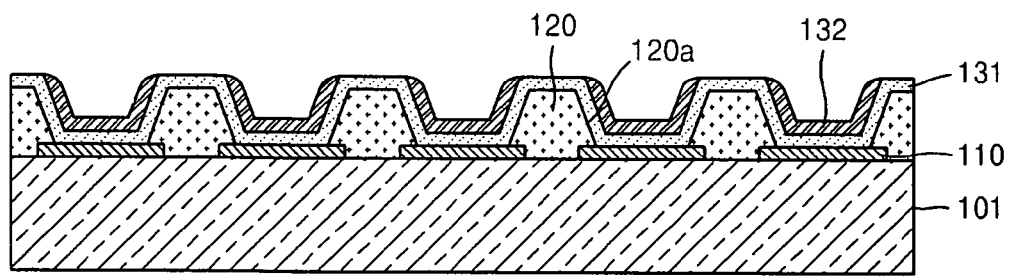

Referring to FIG. 1G, organic light emitting layers 132 may be formed on the charge transport layer 131 inside the openings 120a. For example, the organic light emitting layers 132 may be formed using a nozzle printing method. The organic light emitting layers 132 may include organic light emitting layers which emit red (R), green (G), and blue (B) visible rays.

As described previously, areas of the upper surface 131a of the charge transport layer 131 corresponding to the bottom and side surfaces of the openings 120a are hydrophilic, while other areas of the upper surface 131a of the charge transport layer 131 are made hydrophobic. Thus, the organic light emitting layers 132 may be formed on the charge transport layer 131 inside, e.g., only inside, the openings 120a. In other words, if the organic light emitting layers 132 are hydrophilic and are deposited inside the openings 120a that have hydrophilic surfaces, the organic light emitting layers 132 may be easily arranged only within the openings 120a without spreading to the hydrophobic surfaces surrounding the openings 120a. That is, the organic light emitting layers 132 may not spread to areas corresponding to the upper surface 120b of the PDL 120 or beyond to adjacent openings 120a due to repulsion between the hydrophilic organic light emitting layers 132 and the hydrophobic upper surface 120b. As such, the organic light emitting layers 132 may be easily formed and color mixing may be prevented, thereby improving a picture quality of the organic light emitting display apparatus.

In contrast, when organic light emitting layers are formed according to a conventional method, i.e., without providing hydrophobic/hydrophilic surfaces, organic light emitting layers of adjacent sub-pixels, e.g., organic light emitting layers of different colors, may mix with each other, thereby reducing color purity and picture quality of the display apparatus. In particular, when a nozzle printing method is used, i.e., formation of organic light emitting layers by depositing a solution via a nozzle, mixing of different layers in adjacent sub-pixels may occur, thereby limiting an improvement of a picture quality of an organic light emitting display apparatus.

If the organic light emitting layers 132 emit the R visible rays, the organic light emitting layers 132 may include a red light emitting material, e.g., Tetraphenylnaphthacene Rubrene, Ir(piq)3, Ir(btp)2(acac), Eu(dbm)3(phen), Ru(dtb-bpy)3*2(PF6), DCM1, DCM2, Eu(TTA)3, butyl-6-(1,1,7,7-tetramethyljulolidyl-9-enyl)-4H-pyran (DCJTB), or a polymer organic light emitting material, e.g., polyfluorene polymer, polyvinyl polymer, or the like. If the organic light emitting layers 132 emit the G visible rays, the organic light emitting layers 132 may include a green light emitting material, e.g., Coumarin 6, C545T, DMQA, Ir(ppy)3, or a polymer organic light emitting material, e.g., polyfluorene polymer, polyvinyl polymer, or the like. If the organic light emitting layers 132 emit the B visible rays, the organic light emitting layers 132 may include a B light emitting material, e.g., oxadiazole dimer dyes (Bis-DAPDXP), Spiro compounds (Spiro-DPVBi, Spiro-6P), triarylamine compounds, bis (styryl)amine (DPVBi, DSA), BCzVBi, perylene, TPBe, BCzVB, DPAVBi, DPAVB, BDAVBi, FIrPic, or a polymer light emitting material, e.g., polyfluorene polymer, polyvinyl polymer, or the like.

Figure 1H:
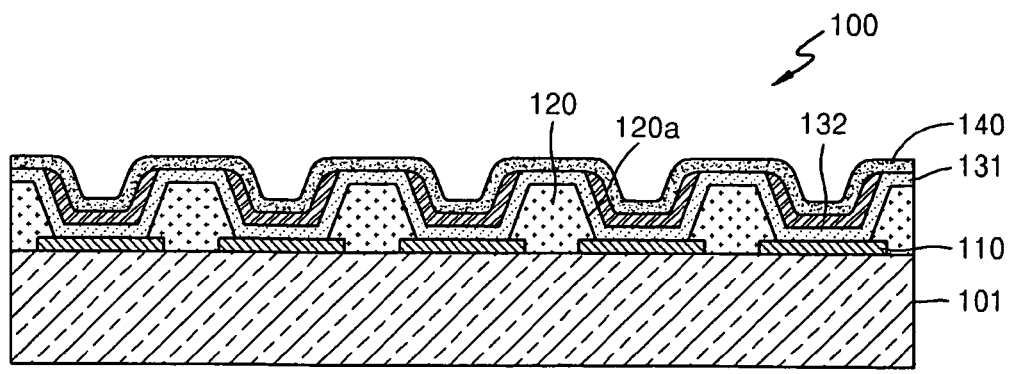

Referring to FIG. 1H, a second electrode 140 may be formed on the organic light emitting layers 132 to complete the manufacture of an organic light emitting display apparatus 100. Although not shown in FIG. 1H, an electron transfer layer (ETL) or an electron injection layer (EIL) may be further formed between the organic light emitting layers 132 and the second electrode 140. The second electrode 140 may have a striped shape to be orthogonal to the patterns of the first electrodes 110 in the PM type organic light emitting display apparatus but may be formed throughout an active area in which an image is to be realized, in the AM type organic light emitting display apparatus.

The second electrode 140 may be a transmissive electrode or a reflective electrode. If the second electrode 140 is a transmissive electrode, a metal having a low work function, i.e., Ag, Mg, Al, Pt, Pd, Au, Ni, Nd, Ir, Cr, Li, Ca, or a compound of Ag, Mg, Al, Pt, Pd, Au, Ni, Nd, Ir, Cr, Li, and Ca, may be deposited, and an auxiliary electrode layer or a bus electrode line may be formed of a transparent conductive material, e.g., ITO, IZO, ZnO, and/or $In_2O_3$, on the metal in order to form the second electrode 140. If the second electrode 140 is a reflective electrode, the second electrode 140 may be formed of a metal having a low work function, i.e., Ag, Mg, Al, Pt, Pd, Au, Ni, Nd, Ir, Cr, Li, Ca, or the like. In example embodiments, the first electrodes 110 may be anode electrodes, and the second electrode 140 may be a cathode electrode. Alternatively, the first electrodes 110 may be cathode electrodes, and the second electrode 140 may be an anode electrode.

Although not shown in FIG. 1H, a sealing member (not shown) may be disposed to face a surface of the substrate 101. The sealing member may protect the organic light emitting layers 132 from external moisture, oxygen, or the like, and may be formed of a transparent material. The sealing member may be formed of glass, plastic, or an overlap structure of a plurality of organic materials and inorganic materials to protect the organic light emitting layers 132.

In the method of the example embodiments, the charge transport layer 131 may be formed on an entire surface of the substrate 101, and the entire upper surface of the charge transport layer 131 may be made hydrophobic. Next, predetermined areas of the upper surface of the charge transport layer 131 on which the organic light emitting layers 132 are to be formed are made hydrophilic. Therefore, the organic light emitting layers 132 may be easily formed in the predetermined areas. In other words, the organic light emitting layers 132 may be prevented from being mixed into adjacent sub-pixels, thereby improving a picture quality of the organic light emitting display apparatus 100.

Areas of the upper surface of the charge transport layer 131 that directly contact the organic light emitting layers 132 are processed, i.e., treated with ultraviolet lamp to form a hydrophilic surface, in order to effectively form the organic light emitting layers 132 in the areas. The first electrodes 110 are prevented from being damaged in the step of processing the upper surface of the charge transport layer 131. As a result, a picture quality of the organic light emitting display apparatus 100 is improved.

FIGS. 2A through 2E illustrate cross-sectional views of stages in a method of manufacturing an organic light emitting display apparatus according to another embodiment. For convenience, description of same elements will not be repeated.

Figure 2A:
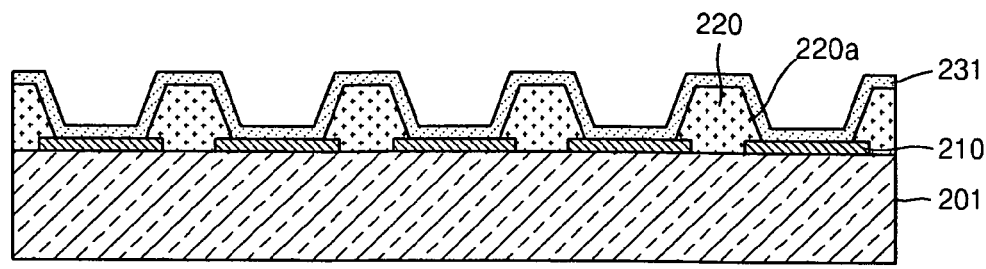
FIGS. 2A through 2E illustrate cross-sectional views of stages in a method of manufacturing an organic light emitting display apparatus according to another embodiment.

Referring to FIG. 2A, first electrodes 210, a PDL 220, and a charge transport layer 231 may be formed on a substrate 201. In more detail, the first electrodes 210 may be formed on the substrate 201, and the PDL 220 may be formed on the first electrodes 210. The PDL 220 may have openings 220a through which the first electrodes 210 are exposed.

The charge transport layer 231 may be formed. The charge transport layer 231 may be formed on a whole surface of the PDL 220 and areas of the first electrodes 210 exposed through the openings 220a. In other words, the charge transport layer 231 may be formed without an additional patterning process. The charge transport layer 231 may include a HTL and/or a HIL.

Structures and materials of the substrate 201, the first electrodes 210, the PDL 220, and the charge transport layer 231 are the same as those of respective substrate 101, the first electrodes 110, the PDL 210, and the charge transport layer 131 of the previous embodiment described previously with reference to FIGS. 1A-1H. Thus, their detailed descriptions will not be repeated.

Figure 2B:
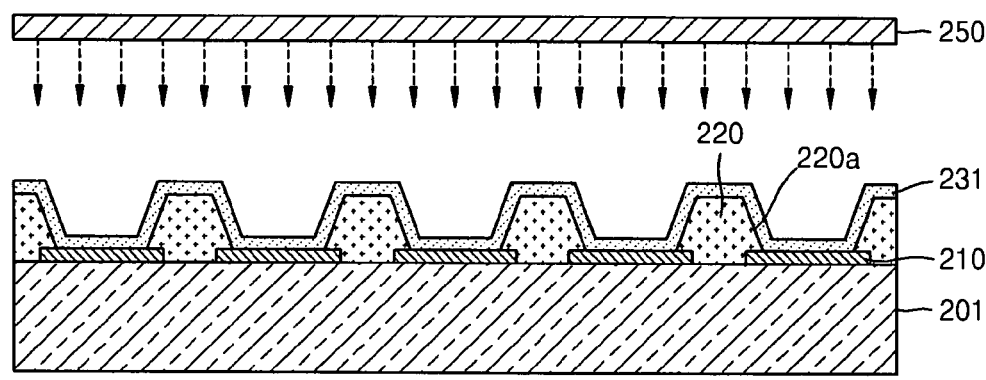

Referring to FIG. 2B, an upper surface of the charge transport layer 231 may be made hydrophobic using a hydrophobic conversion processing unit 250. Here, the whole surface of the charge transport layer 231 may be made hydrophobic.

The hydrophobic conversion processing unit 250 may be a plasma apparatus or an ultraviolet lamp. The hydrophobic processing needs a reaction gas and thus uses a fluoride compound as the reaction gas. In more detail, $CF_4$ is used as the reaction gas. When the hydrophobic conversion processing unit 250 generates plasma or ultraviolet rays in an ambience of $CF_4$, the reaction gas such as $CF_4$ is decomposed to generate fluoride ions, and the fluoride ions adsorb onto the surface of the charge transport layer 231. The surface of the charge transport layer onto which the fluoride ions have adsorbed is combined with fluoride and thus has low surface energy and becomes a hydrophobic surface. It is noted that the hydrophobic conversion processing unit 250 is the same as the hydrophobic conversion processing unit 150 described previously with reference to FIG. 1E.

Figure 2C:
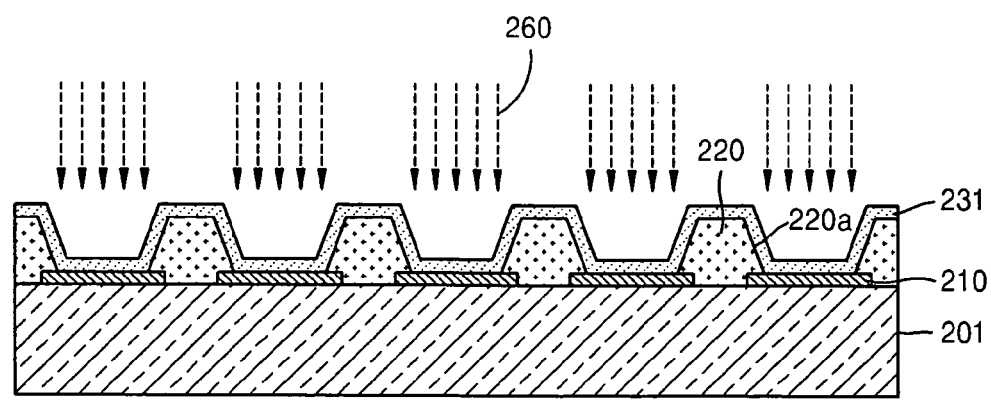

Referring to FIG. 2C, predetermined areas of the upper surface of the charge transport layer 231 may be made hydrophilic. In more detail, areas of the surface of the charge transport layer 232 corresponding to the openings 220a of the PDL 220 may be made hydrophilic.

The hydrophilic process may be performed using ultraviolet laser beams 260 without an additional mask. In other words, the ultraviolet laser beams 260 may be focused and radiated only onto the areas of the upper surface of the charge transport layer 231 corresponding to, e.g., overlapping, the openings 220a, to perform the hydrophilic process. Here, if a single ultraviolet laser source is used, the single ultraviolet laser source may be scanned to respectively radiate the ultraviolet laser beams 260 into the openings 220a. Example embodiments, however, are not limited thereto, e.g., a plurality of ultraviolet laser sources may be used to radiate the ultraviolet laser beams 260. The ultraviolet laser beams 260 that reach the charge transport layer 231 separate combination of the surface of the charge transport layer 231 with the fluoride ions.

The hydrophilic process may be performed in an atmosphere of air or a nitrogen gas. The ultraviolet laser beams 260 ionize the air or the nitrogen gas, and the ions of the air or the nitrogen gas adsorb onto the upper surface of the charge transport layer 231, i.e., in regions where the fluoride ions were separated from the upper surface. Therefore, the upper surface of the charge transport layer 231 onto which the air/nitrogen ions are adsorbed has increased surface energy and becomes a hydrophilic surface.

As a result, areas of the upper surface of the charge transport layer 231 corresponding to, e.g., overlapping, bottom surfaces of the openings 220a exposing the first electrodes 210 and inside surfaces of the openings 220a may be made hydrophilic to have a hydrophilic characteristic. Areas of the upper surface of the charge transport layer 231 corresponding to, e.g., overlapping, an upper surface of the PDL 220 may be made hydrophobic to have a hydrophobic characteristic.

Figure 2D:
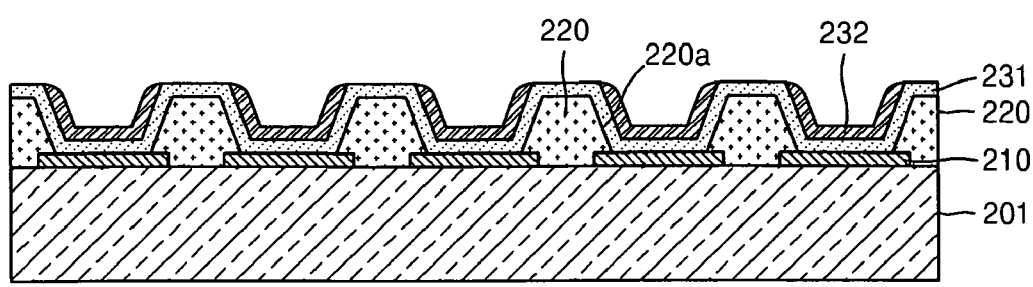

Referring to FIG. 2D, organic light emitting layers 232 may be formed on the charge transport layer 231. Here, the organic light emitting layers 232 may be formed using a nozzle printing method.

As described above, the areas of the surface of the charge transport layer 231 corresponding to the bottom and inside surfaces of the openings 220a may be made hydrophilic, and the other areas of the surface of the charge transport layer 231 may be made hydrophobic, thereby respectively forming the organic light emitting layers 232 in the openings 220a. In other words, the organic light emitting layers 232 may be respectively easily arranged in the opening 220a, i.e., corresponding to sub-pixels, without going beyond the upper surface of the PDL 220 to adjacent openings 220a. Accordingly, the organic light emitting layers 232 may be easily formed in desired patterns, thereby improving a picture quality of the organic light emitting display apparatus.

Figure 2E:
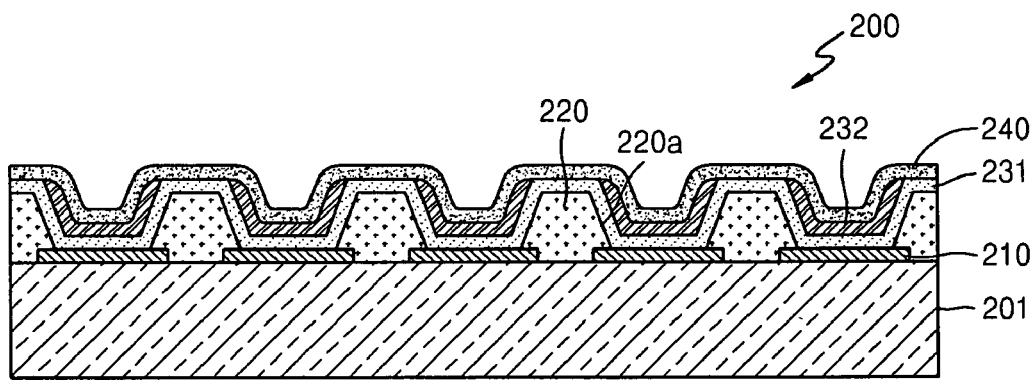

Referring to FIG. 2E, a second electrode 240 may be formed on the organic light emitting layers 232 in order to complete the manufacture of an organic light emitting display apparatus 200. Although not shown in FIG. 2E, an ETL or an EIL may be further formed between the organic light emitting layers 232 and the second electrode 240.

A sealing member (not shown) may be disposed to face a surface of the substrate 201. The sealing member may protect the organic light emitting layers 232 from external moisture or oxygen and may be formed of a transparent material. The sealing member may be formed of glass, plastic, or an overlap structure of a plurality of organic materials and inorganic materials to protect the organic light emitting layers 232.

As described above, in a method of manufacturing an organic light emitting display apparatus according to example embodiments, organic light emitting layers may be easily formed in desired sub-pixels without mixing with adjacent sub-pixels. Thus, a picture quality of the organic light emitting display may be improved.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing an organic light emitting display apparatus, comprising:
    forming first electrodes on a substrate;
    forming a pixel defining layer (PDL) on the substrate and first electrodes, the PDL including openings exposing predetermined areas of the first electrodes;
    forming a charge transport layer on the entire PDL and inside the openings of the PDL;
    performing a hydrophobic process on the charge transport layer;
    performing a hydrophilic process on the charge transport layer,
    wherein the hydrophobic process is performed before the hydrophilic process; and wherein the hydrophobic process is performed on an entire upper surface of the charge transport layer; and the hydrophilic process is performed only on portions of the charge transport layer corresponding to the openings such that said portions of the charge transport layer corresponding to the openings are made hydrophilic;
    forming organic light emitting layers on the charge transport layer; and
    forming a second electrode electrically connected to the organic light emitting layers.

2. The method as claimed in claim 1, wherein the organic light emitting layers are formed inside the openings.

3. The method as claimed in claim 1, wherein the charge transport layer includes at least one of a hole transfer layer and a hole injection layer.

4. The method as claimed in claim 1, wherein performing the hydrophobic process includes using plasma or ultraviolet light under an atmosphere of a fluoride-based gas.

5. The method as claimed in claim 4, wherein the fluoride-based gas is $CF_4$.

6. The method as claimed in claim 1, wherein performing the hydrophilic process includes irradiating ultraviolet light onto regions of the charge transport layer corresponding to the openings.

7. The method as claimed in claim 6, wherein performing the hydrophilic process further comprises use of the ultraviolet light under an atmosphere of air or a nitrogen gas.

8. The method as claimed in claim 7, wherein performing the hydrophilic process further comprises:
    providing a mask having transmissive areas respectively corresponding to the openings; and
    irradiating the ultraviolet light through the mask using an ultraviolet lamp.

9. The method as claimed in claim 7, wherein irradiating ultraviolet light onto regions of the charge transport layer corresponding to the openings includes using an ultraviolet laser.

10. The method as claimed in claim 9, wherein the hydrophilic process is performed by scanning ultraviolet laser beams focused to sizes corresponding to the openings.

11. The method as claimed in claim 1, wherein performing the hydrophilic process includes making portions of the charge transport layer on bottom and side surfaces of the openings hydrophilic.

12. The method as claimed in claim 1, wherein performing the hydrophilic process includes making only an upper surface of the charge transport layer inside the openings of the PDL hydrophilic.

13. The method as claimed in claim 12, wherein, after the hydrophilic process, a hydrophobic portion of the charge transport layer is defined on an upper surface of the PDL around the openings.

14. The method as claimed in claim 13, wherein a portion of a hydrophilic charge transport layer inside each opening is completely surrounded by a portion of a hydrophobic charge transport layer.

15. The method as claimed in claim 1, wherein the organic light emitting layers are formed using a nozzle printing method.

16. An organic light emitting display apparatus manufactured by the method of claim 1.

* * * * *